United States Patent

Hisatomi et al.

[11] Patent Number: 6,163,050
[45] Date of Patent: Dec. 19, 2000

[54] SEMICONDUCTOR DEVICE HAVING INSULATION FILM WHOSE BREAKDOWN VOLTAGE IS IMPROVED AND ITS MANUFACTURING METHOD

[75] Inventors: Kiyoshi Hisatomi; Yuuichi Mikata; Sakae Funo, all of Yokohama; Katsunori Ishihara, Hiratsuka, all of Japan

[73] Assignee: Kabushiki Kaisha Toshiba, Kawasaki, Japan

[21] Appl. No.: 08/963,614

[22] Filed: Nov. 4, 1997

Related U.S. Application Data

[62] Division of application No. 08/571,674, Dec. 13, 1995, Pat. No. 5,714,399.

[30] Foreign Application Priority Data

Dec. 14, 1994 [JP] Japan ................................... 6-310841

[51] Int. Cl.$^7$ .......................... H01L 29/792; H01L 29/76; H01L 29/788
[52] U.S. Cl. .......................... 257/324; 257/314; 257/315; 257/406; 257/410
[58] Field of Search .................................... 257/406, 410, 257/411, 296, 314, 315, 324, 635, 637, 639, 640, 649, 760; 438/769, 786, 216, 261, 591, 593, 288

[56] References Cited

U.S. PATENT DOCUMENTS

| | | | |
|---|---|---|---|
| 4,007,297 | 2/1977 | Robinson et al. | 438/477 |
| 4,621,277 | 11/1986 | Ito et al. | 257/313 |
| 4,725,560 | 2/1988 | Abernathey et al. | 438/394 |
| 4,810,673 | 3/1989 | Freeman | 438/386 |
| 5,407,870 | 4/1995 | Okada et al. | 438/591 |
| 5,464,783 | 11/1995 | Kim et al. | 438/591 |
| 5,498,577 | 3/1996 | Fulford, Jr. et al. | 438/703 |
| 5,506,178 | 4/1996 | Suzuki et al. | 438/773 |

OTHER PUBLICATIONS

C.M. Osburn et al., "Dielectric Breakdown in Silicon Dioxide Films on Silicon," J. Electrochem, Soc.: Solid–State Science and Technology, 119(5):597–603 (1972).
F. Lious et al., "Evidence of Hole Flow in Silicon Nitride for Positive Gate Voltage," IEEE Trans. of Electron Devices, 31(12):1736–1741 (1984).
Wolf, "Silicon Processing for the VLSI ERA," 1986, pp. 191–195

Primary Examiner—Steven H. Loke
Assistant Examiner—Hung K. Vu
Attorney, Agent, or Firm—Finnegan, Henderson, Farabow, Garrett & Dunner, L.L.P.

[57] ABSTRACT

In a silicon substrate, impurity diffusion layers, serving as source and drain regions, are formed to be separated from each other. A gate insulation film is formed on the silicon substrate between these source and drain regions. The gate insulation film is a silicon oxide film containing Cl having concentration of more than $1\times10^{18}$ atoms/cm$^3$ and less than $2\times10^{20}$ atoms/cm$^3$, and the gate insulation film is formed on the silicon substrate by low-pressure CVD. A gate electrode, formed of a polysilicon layer, is formed on the gate insulation film. An inter-level insulation film is formed on a resultant structure. A contact hole is formed on each of the source and drain regions of the inter-level insulation film. A drain electrode is formed on the inter-level insulation film, and connected to the drain region through the contact hole. A source electrode is formed on the inter-level insulation film, and connected to the source region through the contact hole.

3 Claims, 3 Drawing Sheets

SEMICONDUCTOR DEVICE HAVING INSULATION FILM WHOSE BREAKDOWN VOLTAGE IS IMPROVED AND ITS MANUFACTURING METHOD

This is a division of application Ser. No. 08/571,674, filed Dec. 13, 1995, now U.S. Pat. No. 5,714,399.

BACKGROUND OF THE INVENTION

1. Field of the Invention

The present invention relates to a semiconductor device having an insulation film whose breakdown voltage is improved and its manufacturing method, and more particularly to a gate insulation film of a MOS transistor, a dielectric layer of a capacitor, and an inter-insulation film formed between a floating gate and a control gate in a cell transistor of a nonvolatile memory such as an EPROM, and their suitable manufacturing method.

2. Description of the Related Art

Generally, a thermal oxide film, which is formed by thermally oxidizing a surface of a silicon substrate, has been used as a gate insulation film of a MOS transistor. However, in a case where the thermal oxide film is used as a gate insulation film, BMD (Bulk Micro Defect) due to oxygen contained in silicon of the silicon substrate is introduced into the gate insulation film in forming the thermal oxide film by thermally oxidizing the surface of the silicon substrate. As a result, insulation breakdown voltage defect of B mode caused by BMD accounts for about 30% of the manufactured device, so that yield of the manufacture is reduced. The breakdown voltage defect of the gate insulation film caused by BMD accounts for 5 to 7% of the defectiveness of the manufacture.

In J. Electrochem, Soc,: SOLID-STATE SCIENCE AND TECHNOLOGY May 1972, Vol. 119, No. 5, pp. 597–603, C. M. Osburn and D. W. Ormond "Dielectric Breakdown in Silicon Dioxide films on Silicon", an electrostatic breakdown of a thermal oxide film formed on silicon is specifically described.

Also, in for example, IEEE TRANSACTIONS ON ELECTRON DEVICES, VOL. ED-31, NO. 12, DECEMBER 1984, pp. 1736–2741 Fu-tai Liou and Shih-ou Chen "Evidence of Hole Flow in Silicon Nitride for Positive Gate Voltage", there are disclosed a MOS transistor having a gate insulation film having an ONO structure in which a bottom oxide film, a silicon nitride film, and a top oxide film are stacked, and a MOS capacitor having a dielectric layer having an ONO structure.

In a cell transistor (EPROM cell) of a nonvolatile memory such as an EPROM, there has been known a structure using the ONO structure as an inter-insulation film formed between a control gate and a floating gate similar to the gate insulating film of the MOS transistor described in the latter document.

For example, the EPROM cell having the inter-insulation film of the ONO structure is formed as follows.

First of all, a surface of a P type silicon substrate is selectively thermally oxidized so as to form a field oxide film by LOCOS. The surface of the substrate of a device area surrounded with the field oxide film is thermally oxidized so as to form a first thermal oxide film having a thickness of about 200 Å. Then a first polysilicon layer having a thickness of about 1000 Å is formed on the first thermal oxide film. Phosphorus is doped to the first polysilicon layer by thermal diffusion. Thereafter, the polysilicon is selectively etched Sequentially, thermal oxidization is performed at temperature of 950 to 1000° C., so that a second thermal oxide film having a thickness of about 60 Å is formed on the surface of the first polysilicon layer. Then, a silicon nitride layer ($Si_3N_4$ film) having a thickness of about 150 Å is deposited thereon by low-pressure CVD method, and thermal oxidation is performed again at temperature of about 1000° C., so that a third thermal oxide film having a thickness of about 60 Å is formed on the surface. A second polysilicon layer is deposited on the resultant structure, and phosphorus is doped thereto by thermal diffusion.

Thereafter, the second polysilicon layer, the third thermal oxide film, the $Si_3N_4$ film, the second thermal oxide film, the first polysilicon layer, and the first thermal oxide film are sequentially etched by photoetching. As a result, there is formed a stacked gate structure in which a control gate, a second gate insulation film ($SiO_2$ film/$Si_3N_4$ film/$SiO_2$ film), a floating gate, and a first gate insulation film are sequentially stacked.

Next, the above stacked gate structure is used as a mask, and N type impurities are ion-implanted to the silicon substrate, and thermal treatment is provided thereto, so that an $N^+$ drain region and a $N^+$ source region formed. Also, an oxide film is formed on an upper surface of the stacked gate structure and a side wall portion, and an exposed surface of the silicon substrate.

Thereafter, an inter-level insulation film (e.g., PSG film) is deposited on the resultant structure and selectively etched, so that a contact hole is formed on the drain region and the source region. Then, Al-Si-Cu film is formed on the entire surface of the inter-level insulation film and patterned. As a result, a drain electrode and a source electrode are formed, and an EPROM cell is formed.

The above-mentioned EPROM cell is a device in which a positive high voltage is applied to the N+ drain region and the control gate and electrons are injected to the floating gate, thereby writing is performed. The injected electrons are needed to be stored in the floating gate for a long period of time.

However, in the above-mentioned the manufacturing method of the EPROM cell, the bottom oxide film is formed by oxidizing the surface of the polysilicon layer to which impurities are doped. The formed bottom oxide film becomes weak by influence of dopant (phosphorus) and that of grain of polysilicon. The top oxide film is formed by thermally oxidizing the surface of $Si_3N_4$ film. However, if dust is present on the surface of the $Si_3N_4$ film, the portion where dust present is first oxidized. Due to this, a pin hole is generated on the top oxide film, and insulation breakdown voltage is reduced. For the above reason, the voltage of the inter-insulation film of the ONO structure is reduced, the electrons stored in the floating gate are absorbed by the control gate through the bottom oxide film, the $Si_3N_4$ film, and the top oxide film, so that there is possibility that stored data will be erased. The emission of the electrons stored in the floating gate is a fatal defectiveness in the EPROM cell even if the frequency of the generation is rare.

As mentioned above, in the conventional semiconductor device having the insulation film formed by thermally oxidizing the surface of the silicon substrate, there was a problem in which the breakdown voltage of the insulation film is reduced by the influence of the substrate BMD. Also, in the conventional semiconductor device having the insulation film formed by thermally oxidizing the polysilicon layer or the surface of the SiN film, there was a problem in which the breakdown voltage of the insulation film is reduced by the influence of dopant, that of the grain of polysilicon, and presence of dust.

SUMMARY OF THE INVENTION

A first object of the present invention is to a semiconductor device having an insulation film whose breakdown voltage is improved and its manufacturing method.

A second object of the present invention is to provide a semiconductor device, which can prevent a breakdown voltage of an insulation film from being reduced by influence of a substrate BMD, and its manufacturing method.

A third object of the present invention is to provide a semiconductor device, which can prevent a breakdown voltage of an insulation film from being reduced by dopant, influence of grain of polysilicon, and presence of dust, and its manufacturing method.

The first and second objects can be achieved by a semiconductor device comprising a silicon substrate having an impurity diffusion layer and a field oxide film; a CVD silicon oxide film, containing Cl, formed on the silicon substrate, Cl of the CVD silicon oxide film having concentration of more than $1 \times 10^{18}$ atoms/cm$^3$ and less than $2 \times 10^{20}$ atoms/cm$^3$; and a polysilicon layer formed on the CVD silicon oxide film.

According to the above structure, the CVD silicon oxide film, containing Cl having concentration of more than $1 \times 10^{18}$ atoms/cm$^3$ and less than $2 \times 10^{20}$ atoms/cm$^3$, is formed on the silicon substrate. Due to this, the insulation breakdown voltage of the silicon oxide film can be prevented from being reduced by BMD, and the breakdown voltage can be improved as compared with the case in which a thermal oxide film is formed on the silicon substrate.

Also, the first and third objects can be achieved by a semiconductor device comprising a patterned polysilicon layer; a first CVD silicon oxide film, containing Cl, formed on the polysilicon substrate, Cl of the first CVD silicon oxide film having concentration of more than $1 \times 10^{18}$ atoms/cm$^3$ and less than $2 \times 10^{20}$ atoms/cm$^3$; an SiN film formed on the first CVD silicon oxide film; and a second CVD silicon oxide film, containing Cl, formed on the SiN film, Cl of the second CVD silicon oxide film having concentration of more than $1 \times 10^{18}$ atoms/cm$^3$ and less than $2 \times 10^{20}$ atoms/cm$^3$.

According the above structure, the first CVD silicon oxide film, containing Cl having concentration of more than $1 \times 10^{18}$ atoms/cm$^3$ and less than $2 \times 10^{20}$ atoms/cm$^3$, is formed on the polysilicon substrate. Due to this, the reduction of the insulation breakdown voltage of the first CVD silicon oxide film can be prevented without being influenced by dopant to the polysilicon layer or grain of polysilicon. Also, the first CVD silicon oxide film, containing Cl having concentration of more than $1 \times 10^{18}$ atoms/cm$^3$ and less than $2 \times 10^{20}$ atoms/cm$^3$, is formed on the SiN film. Due to this, even if dust is present on the SiN film, the generation of a pin hole can be prevented. Thereby, the insulation breakdown voltage of the second CVD silicon oxide film can be prevented from being reduced. Therefore, the breakdown voltage of ONO film can be improved.

Moreover, the above first and second objects can be achieved by a method for manufacturing a semiconductor device comprising the steps of forming a field oxide film on a silicon substrate; forming a silicon oxide film, containing Cl having concentration of more than $1 \times 10^{18}$ atoms/cm$^3$ and less than $2 \times 10^{20}$ atoms/cm$^3$, on the silicon substrate by CVD; and forming a polysilicon layer formed on the silicon oxide film.

According to the above manufacturing method, the silicon oxide film, containing Cl having concentration of more than $1 \times 10^{18}$ atoms/cm$^3$ and less than $2 \times 10^{20}$ atoms/cm$^3$, on the silicon substrate by CVD. Due to this, BMD is not introduced to the silicon oxide film, and the insulation breakdown voltage of the silicon oxide film can be prevented from being reduced by BMD, and the breakdown voltage can be improved as compared with the case in which the silicon oxide film is formed by thermally oxidizing the silicon substrate.

Moreover, the above first and third object can be achieved by a method for manufacturing a semiconductor device comprising the steps of patterning a first polysilicon layer; forming a first silicon oxide film, containing Cl having concentration of more than $1 \times 10^{18}$ atoms/cm$^3$ and less than $2 \times 10^{20}$ atoms/cm$^3$, on the patterned first polysilicon layer by CVD; forming an SiN film on the first silicon oxide film; and forming a second silicon oxide film, containing Cl having concentration of more than $1 \times 10^{18}$ atoms/cm$^3$ and less than $2 \times 10^{20}$ atoms/cm$^3$, on the SiN film by CVD.

According to the above manufacturing method, the first silicon oxide film, containing Cl having concentration of more than $1 \times 10^{18}$ atoms/cm$^3$ and less than $2 \times 10^{20}$ atoms/cm$^3$, on the polysilicon layer by CVD. Due to this, the reduction of the insulation breakdown voltage of the first silicon oxide film can be prevented without being influenced by dopant to the polysilicon layer or grain of polysilicon. Also, the second silicon oxide film, containing Cl having concentration of more than $1 \times 10^{18}$ atoms/cm$^3$ and less than $2 \times 10^{20}$ atoms/cm$^3$, is formed on the SiN film by CVD. Due to this, even if dust is present on the surface of the SiN film, dust can be covered with the second silicon oxide film, and the insulation breakdown voltage of the second silicon oxide film can be prevented from being reduced. Therefore, the breakdown voltage of ONO film can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
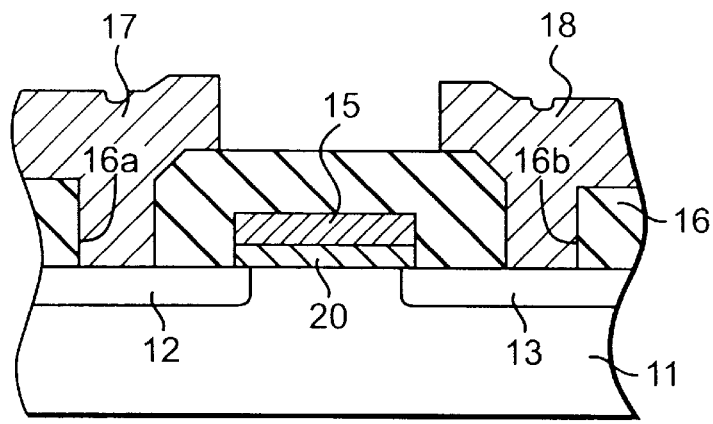
FIG. 1 is a cross sectional view of a MOS transistor to explain a semiconductor device and its manufacturing method in accordance with a first embodiment of the present invention.

FIG. 1 is a cross sectional view of a MOS transistor to explain a semiconductor device in accordance with a first embodiment of the present invention. In a main surface region of a silicon substrate 11, an impurity diffusion layer, serving as a drain region 12, and an impurity diffusion layer, serving as source region 13, are formed to be separated from each other. A gate insulation film 20 is formed on the substrate 11 between the drain and source regions 12 and 13. A gate electrode 15 is formed on the gate insulation film 20. An inter-level insulation film 16 is formed on the resultant structure, and contact holes 16a and 16b are formed on the drain and source regions 12 and 13 of the inter-level insulation film 16, respectively. A drain electrode 17 is formed on the inter-level insulation film 16, and connected to the drain region 12 through the contact hole 16a. A source electrode 18 is formed on the inter-level insulation film 16, and connected to the source region 13 through the contact hole 16b.

The gate insulation film 20 is formed of a CVD silicon oxide film containing Cl whose concentration is more than $1 \times 10^{18}$ atoms/cm$^3$ and less than $2 \times 10^{20}$ atoms/cm$^3$.

The following will explain the manufacturing method of the MOS transistor of FIG. 1.

First of all, the field oxide film is formed on the surface of the silicon substrate 11 by LOCOS (not shown). Sequentially, silicon chloride compound (SiCl$_4$, SiHCl$_3$, SiH$_2$Cl$_2$) gas is reacted with combustion supporting gas (N$_2$O), so that the CVD silicon oxide film 20 is deposited on the surface exposed on the element region of the substrate 11 under a low-pressure condition that reaction temperature is 750 to 950° C. and reaction pressure is 0.2 to 1.0 Torr.

Thereafter, a polysilicon layer is deposited on the CVD silicon oxide film 20, impurities are doped thereto, and the resultant structure is patterned to form a gate electrode 15. Then, the field oxide film and the gate electrode 15 are used as a mask, and impurities are implanted to the substrate 11. Then, impurity diffusion layers, serving as the drain region 12 and the source region 13, are formed by thermal treatment.

Next, the inter-level insulation film (e.g., PSG film) 16 is deposited on the resultant structure, selectively etched, and contact holes 16a and 16b are formed on the drain region 12 and the source region 13, respectively. Then, Al or an Al alloy film is vapor-deposited on the entire surface of the inter-level film 16, patterned to form a drain electrode 17 and a source electrode 18, so that the MOS transistor shown in FIG. 1 is formed.

According to the above-mentioned structure and the manufacturing method, since the gate insulation film is formed by CVD, BMD (Bulk Micro Defect) of the substrate 11 is not introduced to the gate insulation film 20, and insulation breakdown voltage can be prevented from being caused by BMD. Conventionally, the breakdown voltage defect of the gate insulation film caused by BMD accounts for 5 to 7% of the defectiveness of the manufacture. However, according to the present invention, the defect caused by BMD can be reduced to substantially 0%, and products having high reliability can be manufactured with high yield.

In the above-mentioned manufacturing process, after the CVD silicon oxide film 20 is formed, the oxide film 20 is nitrided with NH$_3$ at temperature of 850 to 1000° C., so that an SiON film, serving as gate insulation film 20, may be formed. Then, the polysilicon layer is deposited on the SiON film, impurities are doped to the resultant structure, and patterned to form the gate electrode 15. Regarding the following steps, similar to the above-mentioned steps, the drain, source regions 12 and 13, the inter-level insulation film 16, and the drain and source electrodes 17 and 18 are sequentially formed.

The CVD silicon oxide film 20 is nitrided so as to form the SiON film, so that breakdown voltage of the gate insulation film can be further improved ($Q_{BD}$ is increase).

Figure 2:
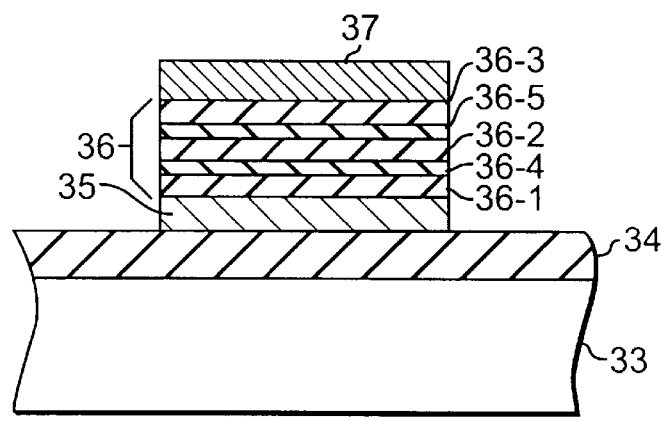
FIG. 2 is a cross sectional view of a capacitor to explain a semiconductor device and its manufacturing device in accordance with a second embodiment of the present invention.

FIG. 2 is a cross sectional view of a capacitor to explain a semiconductor device of the present invention.

More specifically, FIG. 2 shows the capacitor comprising an insulation film 34 is formed on the silicon substrate 33, and a dielectric film 36 having an ONO structure on the insulation film 34. The dielectric film 36 is formed on a first polysilicon layer 35, serving as one of electrodes of the capacitor. The dielectric film 36 is formed by layering a first CVD silicon oxide film 36-1 containing Cl whose concentration is more than $1 \times 10^{18}$ atoms/cm$^3$ and less than $2 \times 10^{20}$ atoms/cm$^3$, an SiN film 36-2, and a second CVD silicon oxide film 36-3 containing Cl whose concentration is more than $1 \times 10^{18}$ atoms/cm$^3$ and less than $2 \times 10^{20}$ atoms/cm$^3$. A second polysilicon layer 37, serving as the other electrode of the capacitor, is formed on the dielectric film 36.

The following will explain the manufacturing method of the capacitor of FIG. 2.

First of all, the insulation film 34 (thermal oxide film) having a thickness of about 500 Å is formed on the surface of the silicon substrate 33. Thereafter, silane gas is thermally decomposed at reaction temperature of 600° C. by low-pressure CVD, so as to form the first polysilicon layer 35 having a thickness of about 1000 Å. By thermal diffusion, phosphorus is doped to the polysilicon layer 35 to reduce the resistance value. Then, dichloro silane gas (gas flow: 90 sccm) and N$_2$O gas (gas flow: 180 sccm) are reacted with each other under conditions that reaction temperature is 780° C. and pressure is 0.1 Torr by low-pressure CVD, thereby forming the silicon oxide film 36-1 having a thickness of about 60 Å. Then, to be continuous to the above step, dichloro silane gas (gas flow: 70 sccm) and HN$_3$ gas (gas flow: 700 sccm) are reacted with other under conditions having the same reaction temperature and pressure of 0.5 Torr by the same device, thereby forming the silicon nitride film 36-2 having a thickness of about 80 Å. Moreover, to be continuous to the above step, the above-mentioned step of forming the silicon oxide film 36-1 is repeated at the same reaction temperature by the same device, thereby forming the silicon oxide film 36-3 having a thickness of about 60 Å. Each of the above-formed silicon oxide film 36-1, the silicon nitride film 36-2, and the silicon oxide film 36-3 forms the dielectric layer 36 of the capacitor. In the above continuous steps, in order not to form an interface between the silicon oxide film 36-1 and the silicon nitride film 36-2, and between the silicon nitride film 36-2, and the silicon oxide film 36-3, dichloro silane continuously introduced into a reaction tube, and NH$_3$ gas is set to flow to the reaction tube two minutes before the flow of N$_2$O is ended at the time of changing N$_2$O gas to NH$_3$ gas.

Next, the second polysilicon layer 37 is deposited on the dielectric layer 36 similar to the first polysilicon layer 35, and phosphorus is thermally diffused to reduce the resistance value. Then, the polysilicon layer 37, the silicon oxide film 36-3, the silicon nitride film 36-2, the silicon oxide film 36-1, and the polysilicon layer 35 (oxide film 35 as necessary) are sequentially etched and patterned by photoetching, thereby forming the capacitor of FIG. 2.

In the above-mentioned explanation, the capacitor was formed on the insulation film 34 after the insulation film 34 was formed on the silicon substrate 33. However, before or after the insulation film 34 is formed, the impurity diffusion layer for forming various kinds of semiconductor elements is formed in the substrate 33. Or, after the capacitor is formed, the impurity diffusion layer and interconnection are formed. Thereby, it is possible to form the capacitor and the other semiconductor elements in the substrate 33. Also, it is of course that other semiconductor elements can be formed by use of the part or all of the capacitor manufacturing process.

In the above-mentioned manufacturing method, since the silicon oxide film 36-1 containing Cl whose concentration is more than $1\times10^{18}$ atoms/cm$^3$ and less than $2\times10^{20}$ atoms/cm$^3$ is formed on the polysilicon layer 35 by CVD, the silicon oxide film 36-1 is not influenced by dopant (phosphorus) of the polysilicon layer 35 or the grain of polysilicon, and the reduction of the insulation breakdown voltage of the silicon oxide film 36-1 can be prevented. Also, the since the silicon oxide film 36-3 containing Cl whose concentration is more than $1\times10^{18}$ atoms/cm$^3$ and less than $2\times10^{20}$ atoms/cm$^3$ is formed on the silicon nitride film 36-2 by CVD. Due to this, even if dust is present on the surface of the silicon nitride film 36-2, dust can be covered with the silicon oxide film 36-3, and the reduction of the insulation breakdown voltage of the silicon oxide film 36-3 can be prevented. Moreover, the silicon oxide film 36-1, the silicon nitride film 36-2, and the silicon oxide film 36-3 are formed at the same reaction temperature in the continuous steps. Also, dichloro silane gas continuously flows during the steps, and N$_2$O gas and NH$_3$ gas flow simultaneously for the fixed period time. Thereby, a SiO$_x$N$_y$ film 36-4 is formed on the interface between the silicon oxide film 36-1 and the silicon nitride film 36-2, a SiO$_x$N$_y$ film 36-5 is formed on and the interface between the silicon nitride film 36-2 and the silicon oxide film 36-3, respectively. Moreover, the number of traps of impurity atoms can be reduced. As a result, the number of portions where concentration of an electric field occurs is largely reduced, so that leak current is decreased and the insulation breakdown voltage can be improved.

Figure 3:
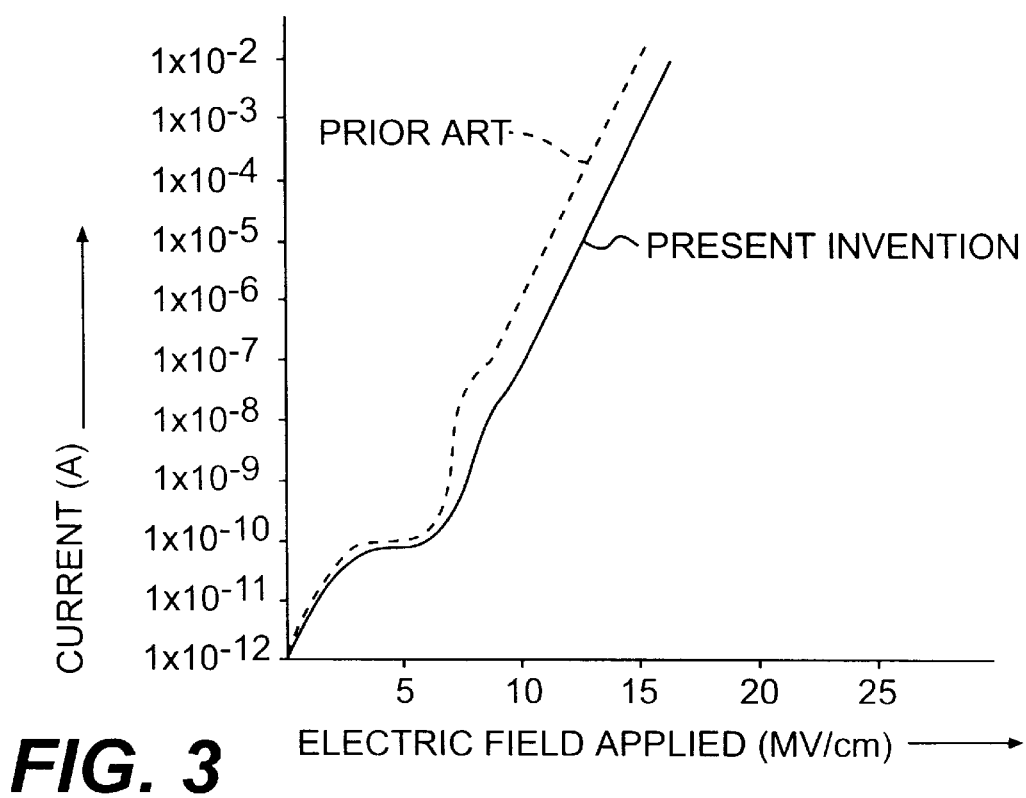
FIG. 3 is a characteristic view showing a comparison between the capacitor formed by the manufacturing method of the present invention and the capacitor manufactured by the conventional manufacturing method in I–V characteristic.

FIG. 3 shows the comparison between the capacitor formed by the above-mentioned manufacturing method and the capacitor formed by the conventional manufacturing method in connection with the I–V characteristic. In the figure, a vertical line shows a current value flowed between the polysilicon layer 35 and the polysilicon layer 37, and a horizontal line shows an electric filed due to the voltage applied to the polysilicon 37. As is obvious from FIG. 3, the leak current of the dielectric film 36 can be reduced by the manufacturing method of the present invention as compared with the conventional method.

Figure 4:
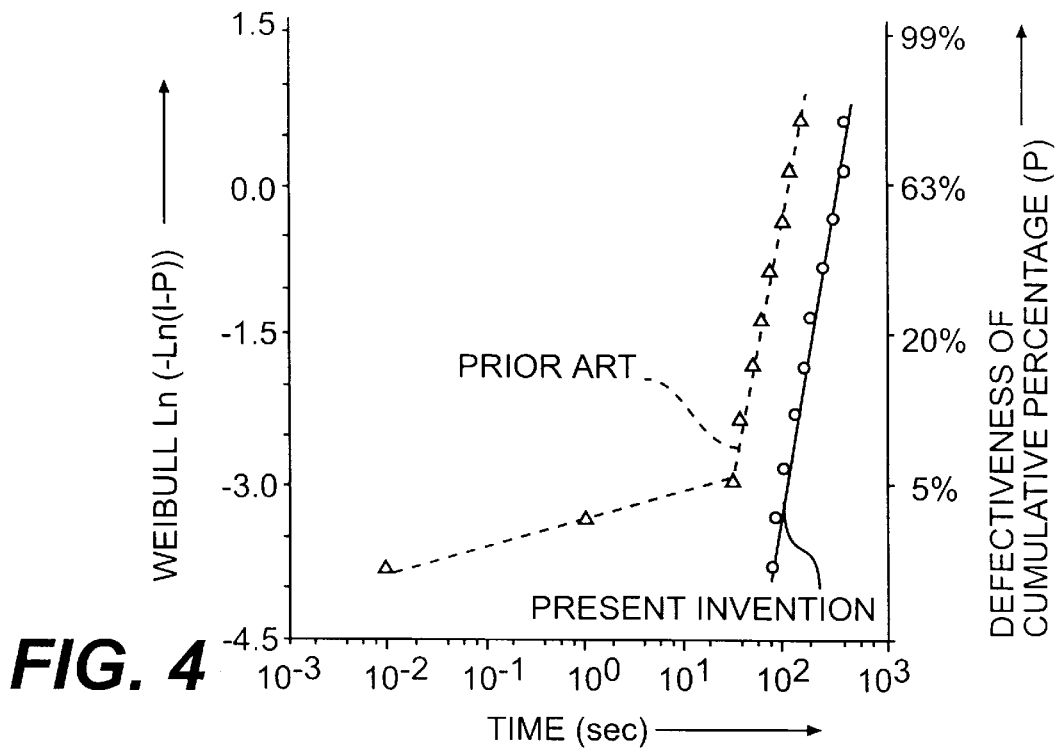
FIG. 4 is a characteristic view showing a result of the measurement of TDDB characteristic by use of the capacitor formed by the manufacturing method of the present invention.

FIG. 4 shows the result in which TDDB characteristic is measured by the above-mentioned capacitor. In the capacitor formed by the manufacturing method of the present invention, it is clear from the figure that time, which is needed to reach to the same defective rate as the conventional case, is increased about double.

In the above-mentioned second embodiment, after the bottom oxide film (silicon oxide film 36-1) is formed, the silicon oxide film 36-1 is nitrided with NH$_3$ at temperature of 850 to 1000° C., so that the SiON film is formed. Also, after the top oxide film (silicon oxide film 36-3) is formed, the silicon oxide film 36-1 is nitrided with NH$_3$ at temperature of 850 to 1000° C., so that the SiON film may be formed. In other words, in forming the dielectric film 36 having the ONO structure, dichloro silane gas (gas flow: 90 sccm) and N$_2$O gas (gas flow: 180 sccm) are reacted with other under conditions that reaction temperature is 780° C. and pressure is 0.1 Torr by low-pressure CVD, thereby forming the silicon oxide film 36-1 having a thickness of 60 Å is formed on the polysilicon layer 35. Thereafter, NH$_3$ gas is introduced to the reactive tube of CVD device to nitride the silicon oxide film 36-1, so that the bottom oxide film formed of SiON is formed. Then, to be continuous to the above step, dichloro silane gas (gas flow: 70 sccm) and NH$_3$ gas (gas flow: 700 sccm) are reacted with other under conditions having the same reaction temperature and pressure of 0.5 Torr by the same device, thereby the silicon nitride film 36-2 having a thickness of 80 Å is formed on the bottom oxide film. Moreover, to be continuous to the above step, dichloro silane gas (gas flow: 90 sccm) and H$_2$O gas (gas flow: 180 sccm) are reacted with other under conditions having the same reaction temperature and pressure of 0.1 Torr by the same device, thereby the silicon nitride film 36-3 having a thickness of 60 Å is formed. Thereafter, NH$_3$ gas is introduced to the reaction tube to nitride the silicon oxide film 36-3, so that the top oxide film formed of SiON is formed.

As explained above, if the SiON films are formed as the bottom oxide film 36-1 and the top oxide film 36-3, the dielectric constant can be increased, and the film thinning can be improved. Moreover, since the SiON film is not easily oxidized, the bird's beak formed on the interface between the first polysilicon layer 35 and the bottom oxide film 36-1 and the interface between the top oxide film 36-3 and the second polysilicon layer 37 can be reduced.

Figure 5A:
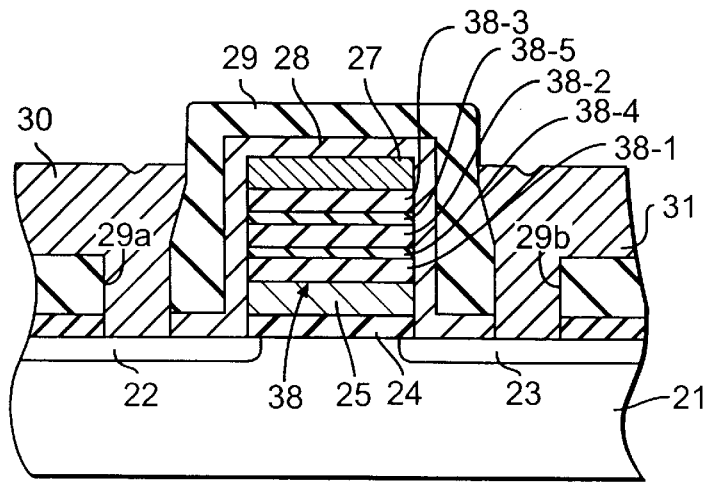
FIGS. 5A and 5B are cross sectional views of an EPROM cell to explain a semiconductor device and its manufacturing device in accordance with a third embodiment of the present invention.

FIG. 5A explains a semiconductor device of a third embodiment of the present invention, and shows a cell transistor (EPROM cell) in a nonvolatile memory such as an EPROM. In the EPROM cell, the ONO structure as explained as the inter-insulation film is used, and the structure between the control gate and the floating gate is the same as the capacitor shown in FIG. 2. An N$^+$ type impurity diffusion layer, serving as a drain region 22, and an N$^+$ type impurity diffusion layer, serving as a source region 23, are formed in a main surface area of a P$^-$ type silicon substrate 21 to be separated from each other. A first gate insulation film (first thermal oxide film) 24, a floating gate 25, a second gate insulation film (inter-insulation film) 38 having an ONO structure, and a control gate 27 are stacked on the substrate 21 between the drain and source regions 22 and 23. The second gate insulation film 38 is formed by layering a first CVD silicon oxide film (bottom oxide film) 38-1 containing Cl whose concentration is more than $1\times10^{18}$ atoms/cm$^3$ and less than $2\times10^{20}$ atoms/cm$^3$, a silicon nitride film 38-2, and a second CVD silicon oxide film (top oxide film) 38-3 containing Cl whose concentration is more than $1\times10^{18}$ atoms/cm$^3$ and less than $2\times10^{20}$ atoms/cm$^3$. Then, an oxide film 28 is formed on the upper surface of the above stacked gate structure, the side wall, and the main surface of the substrate 21. An inter-level insulation film (PSG film) 29 is formed on the resultant structure, and contact holes 29a and 29b are formed on the drain and source regions 22 and 23, respectively. A drain electrode 30 is formed on the inter-level insulation film 29 to be connected to the drain region 22 through the contact hole 29a. A source electrode 31 is formed on the inter-level insulation film 29 to be connected to the source region 23 through the contact hole 29b.

Figure 5B:
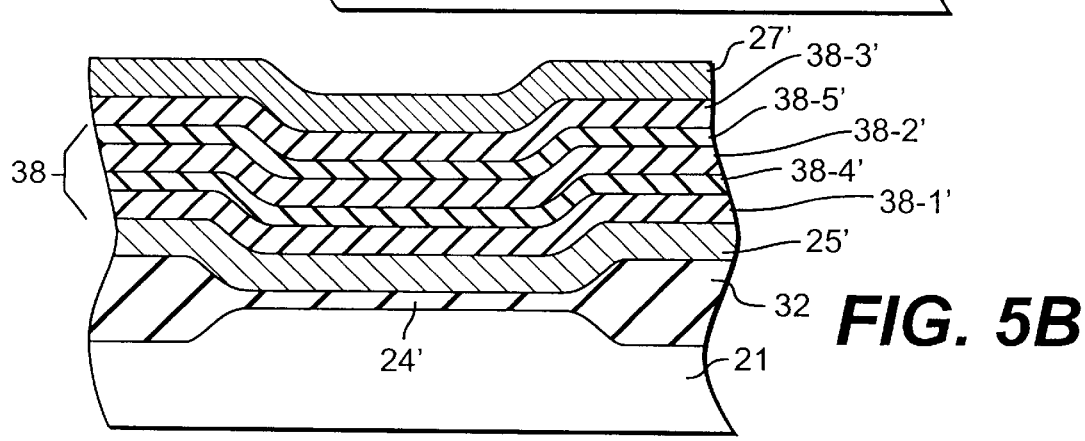

The following will explain the manufacturing method of the cell transistor of FIG. 5A with reference to FIG. 5B.

First, a surface of a P-type silicon substrate 21 is selectively oxidized by LOCOS to form a field oxide film 32. The surface of the element region, which is surrounded with the field oxide film 32 in the silicon substrate 21, is thermally oxidized to form a first thermal oxide film 24' having a thickness of about 200 Å. Then, a first polysilicon layer 25' having a thickness of about 1000 Å is formed on the thermal oxide film 24'60 by CVD. After phosphorus is doped to the polysilicon layer 25' by thermal diffusion, a region (not shown) of the polysilicon layer 25' is selectively etched. Sequentially, dichloro silane gas (gas flow: 90 sccm) and $N_2O$ gas (gas flow: 180 sccm) are reacted with other under conditions that reaction temperature is 780° C. and pressure is 0.1 Torr by low-pressure CVD, thereby forming a silicon oxide film 38-1' having a thickness of about 60 Å. Then, to be continuous to the above step, dichloro silane gas (gas flow: 70 sccm) and $HN_3$ gas (gas flow: 700 sccm) are reacted with other under conditions having the same reaction temperature and pressure of 0.5 Torr by the same device, thereby forming a silicon nitride film ($Si_3N_4$ film) 38-2' having a thickness of about 80 Å. Moreover, to be continuous to the above step, the above-mentioned step of forming the silicon oxide film 38-1' is repeated at the same reaction temperature by the same device, thereby forming a silicon oxide film 38-3' having a thickness of about 60 Å. Each of the above-formed silicon oxide film 38-1', the silicon nitride film 38-2', the silicon oxide film 38-3', the $SiO_xN_y$ film 38-4', and the $SiO_xN_y$ film 38-5' forms an inter-insulation film 38. In the above continuous steps, in order not to form an interface between the silicon oxide film 38-1' and the silicon nitride film 38-2', and between the silicon nitride film 38-2', and the silicon oxide film 38-3', dichloro silane continuously introduced into the reaction tube, and $NH_3$ gas is set to flow to the reaction tube two minutes before the flow of $N_2O$ is ended at the time of changing $N_2O$ gas to $NH_3$ gas. Thereafter, the second polysilicon layer 27' is deposited on the the resultant structure, and phosphorus is doped thereto by thermal diffusion.

Then, the second polysilicon layer 27', the silicon oxide film 38-3', the $Si_3N_4$ film 38-2', the silicon thermal oxide film 38-1', the first polysilicon layer 25', and the thermal oxide film 24' are sequentially etched by photoetching. Then, as shown in FIG. 5A, the control gate 27, the second gate insulation film 38 ($SiO_2$ film 38-1/$Si_3N_4$ film/$SiO_2$ film 38-3), the floating gate 25, and the first gate insulation film 24 are formed.

Thereafter, the above layer gate structure is used as a mask, and N type impurity material is ion-implanted to the silicon substrate 21. Then, thermal treatment is provided thereto, the $N^+$ drain region 22 and $N^+$ source region 23 are formed, and the oxide film 28 is formed on the upper surface of the stacked gate structure, and the side wall section, and the exposed surface of the substrate 21.

Sequentially, the inter-level insulation film (e.g., PSG film) is formed on the resultant structure, and selectively etched to form contact holes 29a and 29b on the drain region 22 and the source region 23. Then, Al-Si-Cu film is deposited on the entire surface of the inter-level insulation film 29, and patterned to form the drain electrode 30 and the source electrode 31. Thereby, the EPROM cell as shown in FIG. 5A is formed.

The above explained the manufacturing process in view of only the manufacturing method of the EPROM cell. However, in a case where a peripheral circuit is formed in the substrate 21, impurity diffusion layer for forming various semiconductor elements may be formed in the substrate 21 prior to the the manufacturing process of the cell transistor, the impurity diffusion forming the cell transistor, the impurity diffusion layer or interconnection are formed, thereby the cell transistor and the other semiconductor elements are formed in the substrate 21. Or, the insulation film of the other semiconductor element or the electrode, the interconnection, and the active region may be formed by use of a part of the manufacturing process of the cell transistor.

According to the above-mentioned structure and the manufacturing method, since the silicon oxide film 38-1 containing Cl whose concentration is more than $1 \times 10^{18}$ atoms/$cm^3$ and less than $2 \times 10^{20}$ atoms/$cm^3$ is formed on the floating gate 25 by CVD, the silicon oxide film 38-1 is not influenced by dopant (phosphorus) of the floating gate 25 or the grain of polysilicon, and the reduction of the insulation breakdown voltage of the silicon oxide film 38-1 can be prevented. Also, the silicon oxide film 38-3 containing Cl whose concentration is more than $1 \times 10^{18}$ atoms/$cm^3$ and less than $2 \times 10^{20}$ atoms/$cm^3$ is formed on the silicon nitride film 38-2 by CVD. Due to this, even if dust is present on the surface of the silicon nitride film 38-2, the the surface where dust is present can be covered with the silicon oxide film 38-3, and the reduction of the breakdown voltage of the silicon oxide film 38-3 can be prevented. Moreover, the silicon oxide film 38-1, the silicon nitride film 38-2, and the silicon oxide film 38-3 are formed at the same reaction temperature in the continuous steps. Also, dichloro silane gas continuously flows during the continuous steps, and $N_2O$ gas and ammonia gas flow simultaneously for the fixed period time.

Thereby, a $SiO_xN_y$ film 38-4 is formed on the interface between the silicon oxide film 38-1 and the silicon nitride film 38-2, $SiO_xN_y$ film 38-5 is formed on and the interface between the silicon nitride film 38-2 and the silicon oxide film 38-3, respectively. Moreover, the number of traps of impurity atoms can be reduced. As a result, the number of portions where concentration of an electric field occurs is largely reduced, so that lead current is decreased and the insulation breakdown voltage can be improved. Therefore, there is no possibility that the electrons stored in the floating gate of the EPROM cell will be emitted to the control gate 27, and the electron maintaining characteristic can be improved and reliability can be increased.

Similar to the second embodiment, in the third embodiment, the silicon oxide films 38-1 and 38-3 may be nitrided to from SiON films, respectively. In this case, dichloro silane gas (gas flow: 90 sccm) and $N_2O$ gas (gas flow: 180 sccm) are reacted with other under conditions that reaction temperature is 780° C. and pressure is 0.1 Torr by low-pressure CVD, thereby forming the silicon oxide film 38-1' having a thickness of 60 Å is formed on the polysilicon layer 25'. Thereafter, $NH_3$ gas is introduced to the reactive tube of CVD device to nitride the silicon oxide film 38-1', so that the bottom oxide film formed of SiON is formed. Then, to be continuous to the above step, dichloro silane gas (gas flow: 70 sccm) and $HN_3$ gas (gas flow: 700 sccm) are reacted with other under conditions having the same reaction temperature and pressure of 0.5 Torr by the same device, thereby the silicon nitride film 38-2' having a thickness of 80 Å is formed on the bottom oxide film. Moreover, to be continuous to the above step, dichloro silane gas (gas flow: 90 sccm) and $H_2O$ gas (gas flow: 180 sccm) are reacted with other under conditions having the same reaction temperature and pressure of 0.1 Torr by the same device, thereby the silicon nitride film 38-3' having a thickness of 60 Å is formed. Thereafter, $NH_3$ gas is introduced to the reactive tube to nitride the silicon oxide film 38-3', so that the top oxide film formed of SiON is formed.

As explained above, if the SiON films are formed as the bottom oxide film 38-1' and the top oxide film 38-3', the dielectric constant can be increased, and the film thinning can be improved. Moreover, the bird's beak formed on the interface between the first polysilicon layer 25 and the bottom oxide film 38-1 and the interface between the top oxide film 38-3 and the second polysilicon layer 27 can be reduced.

Figure 6A:
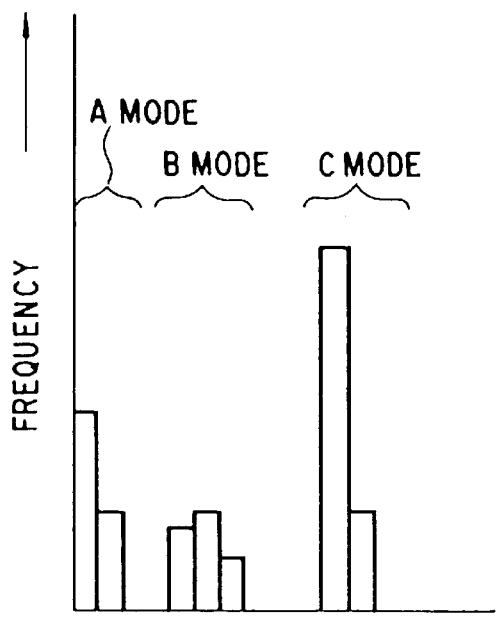
FIGS. 6A to 6C are graphs each showing a result of analysis performed to find out an optimum value of Cl contained in a CVD silicon oxide film in each of the above embodiments.
Figure 6B:
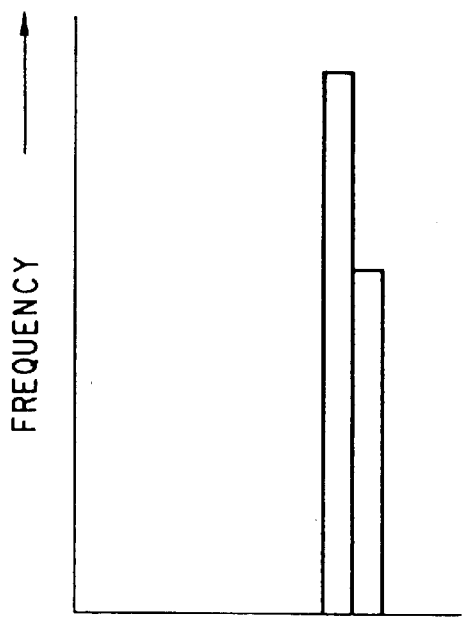
Figure 6C:
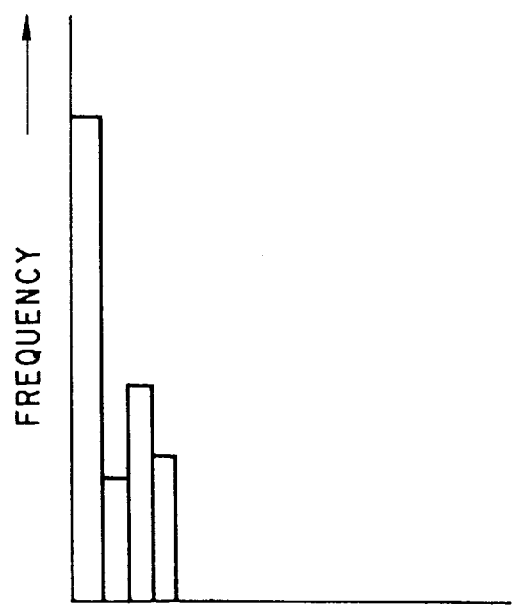

FIGS. 6A to 6C are graphs each showing a result of analysis performed to find out an optimum value of Cl contained in a CVD silicon oxide film in each of the above embodiments. FIG. 6A shows a case in which concentration of Cl is $1\times10^{18}$ atoms/cm$^3$ or less. In the case of using the above concentration, insulation breakdown defectiveness is generated in mode B, and it can be understood that a sufficient effect cannot be obtained when concentration of Cl is $1\times10^{18}$ atoms/cm$^3$ or less. FIG. 6B shows a case in which concentration of Cl is $1\times10^{19}$ atoms/cm$^3$. In this case, the mode, which is the defectiveness is generated, is only mode C, and the insulation breakdown defectiveness can be surely prevented. FIG. 6C shows a case in which concentration of Cl is $2\times10^{20}$ atoms/cm$^3$ or more. The insulation breakdown defectiveness is not generated in mode C. However, the insulation breakdown defectiveness is generated in modes A and B. Moreover, if concentration of Cl exceeds $2\times10^{20}$ atoms/cm$^3$, the insulation breakdown defectiveness sharply worsens. As is obvious from the above results of analyses, concentration of Cl of the CVD silicon oxide film is $1\times10^{18}$ atoms/cm$^3$ ore more and $2\times10^{20}$ atoms/cm$^3$ or less, preferably $1\times10^{20}$ atoms/cm$^3$ or less.

The conventional product yield of the nonvolatile memory using the thermal oxide film as an inter-insulation film was about 30%. However, according to the present invention, since it is confirmed that the product yield of 60% can be obtained, and the product yield can be largely improved.

The above second and third embodiments explained the case in which dichloro silane gas is used to form the silicon oxide films 36-1, 38-1, the silicon nitride films 36-2, 38-2, and the silicon oxide films 36-3, and 38-3. However, even if monosilane gas or disilane gas is used, the same effect can be obtained. Moreover, the second and third embodiments explained the case in which favorable reaction temperature is set to 0.1 Torr and 0.5 Torr. However, if the reaction temperature ranges 0.1 to 1.0 Torr, there is no problem is forming the films. Moreover, the second and third embodiments explained the case in which the insulation film (dielectric film) has the ONO structure. However, similar to the first embodiment, this can be applied to one-layer insulation film or one-layer dielectric film is formed.

The above embodiments explained the case in which the MOS transistor, the MOS capacitor, and the EPROM transistor are used as the semiconductor device. However, it is of course that the present invention can be applied to the other semiconductor device in which the silicon oxide film is formed on the silicon substrate, the polysilicon layer, and the silicon nitride film and the electric field is applied to the silicon oxide film, and its manufacturing method.

What is claimed is:

1. A semiconductor device comprising:

a patterned first polysilicon layer, a first CVD silicon oxide film, containing Cl, formed on said first polysilicon layer, Cl of said first CVD silicon oxide film having concentration of more than $1\times10^{18}$ atoms/cm$^3$ and less than $2\times10^{20}$ atoms/cm$^3$;

an SiN film formed on said first CVD silicon oxide film;

a first SiOxNy film provided on an interface between said first CVD silicon oxide film and said SiN film and formed of said first CVD silicon oxide film nitrided with $NH_3$;

a second CVD silicon oxide film, containing Cl, formed on said SiN film, Cl of said second CVD silicon oxide film having concentration of more than $1\times10^{18}$ atoms/cm$^3$ and less than $2\times10^{20}$ atoms/cm$^3$;

a second polysilicon layer formed on said second CVD silicon oxide film; and a second SiOxNy film provided on an interface between said second CVD silicon oxide film and said second polysilicon layer and formed of said second CVD silicon oxide film nitrided with $NH_3$.

2. A semiconductor device comprising:

a patterned polysilicon layer, a first CVD SiON film, containing Cl, formed on said polysilicon layer, Cl of said first CVD SiON film having concentration of more than $1\times10^{18}$ atoms/cm$^3$ and less than $2\times10^{20}$ atoms/cm$^3$;

an SiN film formed on said first CVD SiON film; and a second CVD SiON film, containing Cl, formed on said SiN film, Cl of said second CVD SiON film having concentration of more than $1\times10^{18}$ atoms/cm$^3$ and less than $2\times10^{20}$ atoms/cm$^3$.

3. A semiconductor device comprising:

a patterned polysilicon layer, a first CVD silicon oxide film, containing Cl, formed on said first polysilicon layer, the Cl in said first CVD silicon oxide film having a concentration of more than $1\times10^{18}$ atoms/cm$^3$ and less than $2\times10^{20}$ atoms/cm$^3$;

a bottom oxide film of SiON, formed by nitriding said first CVD silicon oxide film;

a silicon nitride film formed on said bottom oxide film;

a second CVD silicon oxide film, containing Cl, formed on said silicon nitride film, the Cl in said second CVD silicon oxide film having a concentration of more than $1\times10^{18}$ atoms/cm$^3$ and less than $2\times10^{20}$ atoms/cm$^3$;

a top oxide film of SiON, formed by nitriding said second CVD silicon oxide film; and a second polysilicon layer formed on said top oxide film.

* * * * *